United States Patent
Gruber et al.

(10) Patent No.: US 11,050,423 B1
(45) Date of Patent: Jun. 29, 2021

(54) FLIP-FLOP DEVICE AND METHOD OF OPERATING FLIP-FLOP DEVICE

(71) Applicant: TAIWAN SEMICONDUCTOR MANUFACTURING COMPANY LTD., Hsinchu (TW)

(72) Inventors: Greg Gruber, Hsinchu (TW); Chi-Lin Liu, New Taipei (TW); Ming-Chang Kuo, Hsinchu County (TW); Lee-Chung Lu, Taipei (TW); Shang-Chih Hsieh, Taoyuan County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/744,836

(22) Filed: Jan. 16, 2020

(51) Int. Cl.
*H03K 19/00* (2006.01)
*G01R 31/3185* (2006.01)

(52) U.S. Cl.
CPC .. *H03K 19/0013* (2013.01); *G01R 31/318536* (2013.01)

(58) Field of Classification Search
CPC .............. G01R 31/318536; H03K 19/0013
See application file for complete search history.

(56) References Cited

U.S. PATENT DOCUMENTS

| | | | | |
|---|---|---|---|---|
| 6,289,477 | B1* | 9/2001 | Gunadisastra | ............................ G01R 31/318541 324/750.3 |
| 7,411,413 | B2* | 8/2008 | Shimazaki | ..... G01R 31/318575 326/16 |
| 7,872,513 | B2* | 1/2011 | Uchida | ............ H03K 3/356156 327/203 |
| 8,525,565 | B2* | 9/2013 | Rahman | ................. H03K 3/356 327/202 |
| 8,570,086 | B2* | 10/2013 | Hirairi | .................... G11C 19/00 327/212 |
| 8,970,274 | B2* | 3/2015 | Geisler | ............ H03K 3/356113 327/239 |
| 2012/0223739 | A1* | 9/2012 | Jung | .............. G01R 31/318541 326/46 |
| 2017/0141766 | A1* | 5/2017 | Kao | ................... H03K 3/35625 |

\* cited by examiner

*Primary Examiner* — Kurtis R Bahr
(74) *Attorney, Agent, or Firm* — WPAT, P.C., Intellectual Property Attorneys; Anthony King

(57) ABSTRACT

An integrated circuit includes: a flip-flop circuit arranged to receive an input data for generating a master signal during a writing mode according to a first clock signal and a second clock signal, and to output an output data according to the first clock signal and the second clock signal during a storing mode; and a gating circuit coupled to the flip-flop circuit, for generating the first clock signal and the second clock signal according to the master signal and an input clock signal; wherein a first signal transition number of the first clock signal and a second signal transition number of the second clock signal are not greater than a third signal transition number of the input clock signal during the writing mode and the storing mode.

20 Claims, 12 Drawing Sheets

FLIP-FLOP DEVICE AND METHOD OF OPERATING FLIP-FLOP DEVICE

BACKGROUND

Generally, flip-flops (e.g. Scan flip-flop) are widely used integrated circuits in the semiconductor industry. One use of the flip-flops may be for testing devices in a semiconductor chip. For example, the scan flip-flop may receive a scan input so as to test a logic circuit in the chip. Besides testing devices on a chip, there are many uses for flip-flops. The flip-flops are the standard means for storing state information in digital electronics. Scan flip-flops generally have a circuit interposed on data signal paths for selectively choosing which signal is input into the flip-flop. For example, a multiplexer may be present in the data path to selectively output a data signal, a feedback signal, or a scan input signal. The operation of a flip-flop is controlled by a full-activity clock signal. While reducing active power may be the most desirable in mobile applications, these days it is desirable in almost all applications. When a large number of flip-flops is applied in an integrated circuit, the flip-flops may dominate the power consumption of the integrated circuit. Therefore, reducing the active power of a flip-flop is highly desirable in the field of mobile applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
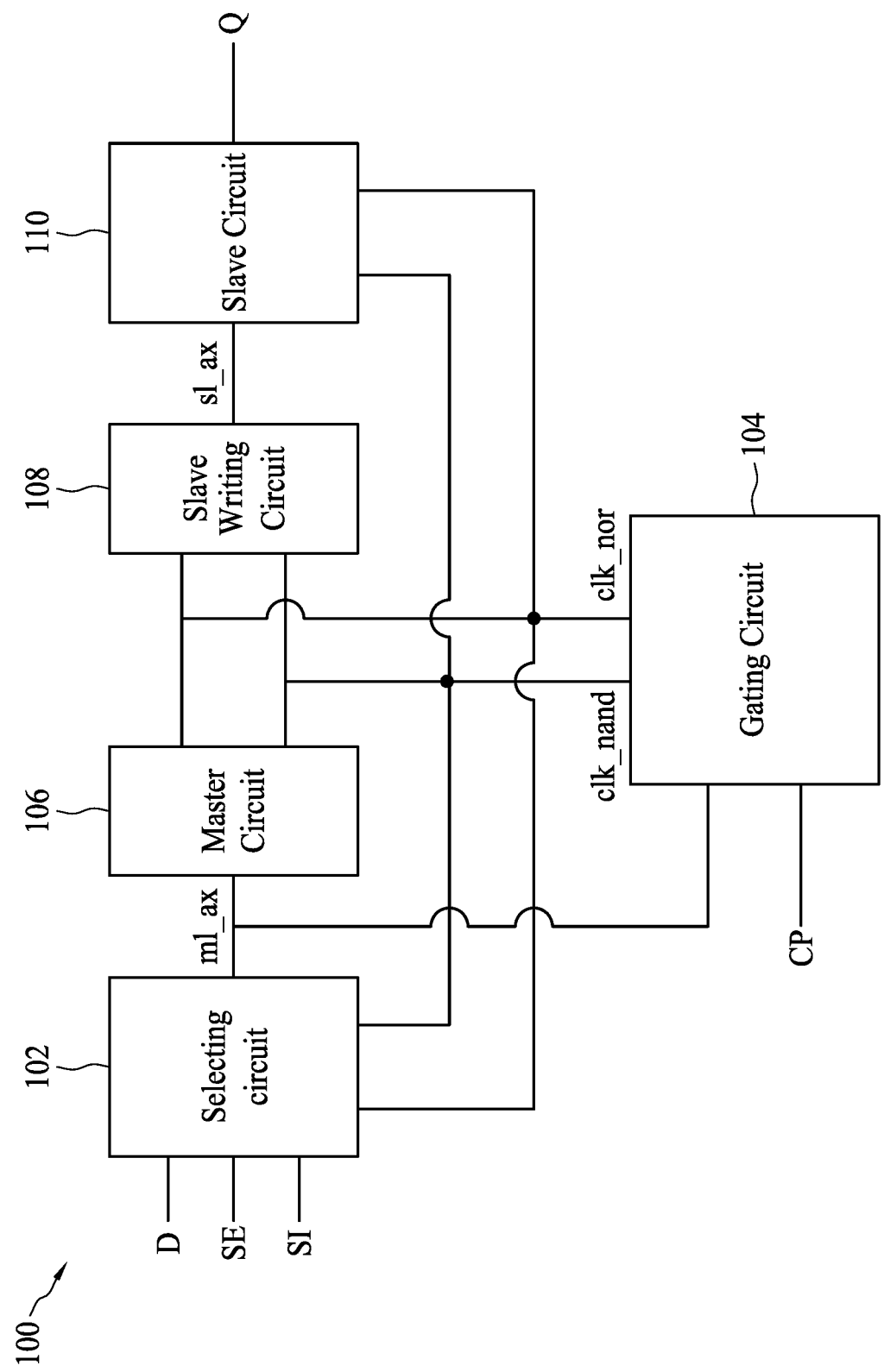
FIG. 1 is a diagram illustrating a flip-flop device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating an integrated circuit (e.g. a flip-flop device 100) in accordance with some embodiments. The flip-flop device 100 may be a scan flip-flop. A scan flip-flop may have one terminal receiving the data input (D), another other terminal serving as the Scan-input (SI), and another terminal receiving the Scan Enable (SE) to control the selection between the data input and the Scan-input. According to some embodiments, the present flip-flop device 100 comprises a flip-flop circuit and a gating circuit 104. The flip-flop circuit includes a selecting circuit 102, a master circuit 106, a slave writing circuit 108, and a slave circuit 110.

The flip-flop circuit is arranged to receive an input data D for generating a master signal ml_ax during a writing mode according to a first clock signal clk_nand and a second clock signal clk_nor, and to output an output data Q according to the first clock signal clk_nand and the second clock signal clk_nor during a storing mode. According to some embodiments, the flip-flop circuit may always generate the output data Q irrespective of the operation mode. For example, during the writing mode, the current value of the output data Q is held and the output data Q is outputted accordingly. During the storing mode, a new value may be generated to be the output data Q based on the first clock signal clk_nand and the second clock signal clk_nor. The gating circuit 104 is coupled to the flip-flop circuit for generating the first clock signal clk_nand and the second clock signal clk_nor according to the master signal ml_ax and an input clock signal CP. According to some embodiments, a first signal transition number of the first clock signal clk_nand and a second signal transition number of the second clock signal clk_nor are not greater than a third signal transition number of the input clock signal CP during the writing mode and the storing mode. More specifically, in some embodiments, the first signal transition number of the first clock signal clk_nand and the second signal transition number of the second clock signal clk_nor are smaller than the third signal transition number of the input clock signal CP. However, in the case where the master signal ml_ax never toggles due to the input data D, one of the first clock signal clk_nand or the second clock signal clk_nor may never toggle. Then, the signal transition number of the other clock signal (i.e. the toggle clock signal) may be similar to the signal transition number of the input clock signal CP, i.e. the other clock signal may toggle with the same activity as the input clock signal CP. Anywhere, during the normal operation of the flip-flop device 100, the average toggle rate (or signal transition rate) for the first clock signal clk_nand and the second clock signal clk_nor are half the toggle rate of the input clock signal CP. The average toggle rate for the first clock signal clk_nand and the second clock signal clk_nor may be obtained by the following equation (1):

$$\text{average\_toggle\_rate}=[\text{toggle\_rate\_clk\_nand}/2]+[\text{toggle\_rate\_clk\_nor}/2] \quad (1)$$

The parameter average_toggle_rate is the average toggle rate for the first clock signal clk_nand and the second clock signal clk_nor. The parameter toggle_rate_clk_nand is the toggle rate of the first clock signal clk_nand. The parameter toggle_rate_clk_nor is the toggle rate of the second clock signal clk_nor.

The selecting circuit 102 may be a multiplexer. The selecting circuit 102 is arranged to receive an input data D, a scan enable signal SE, a scan input SI, a first clock signal clk_nand, a second clock signal clk_nor, and to output a master signal ml_ax according to the scan enable signal SE, the first clock signal clk_nand, and the second clock signal clk_nor. More specifically, when the scan enable signal SE is the high voltage level (for example, the high voltage level may be Vdd or close to Vdd) in the test mode of the flip-flop device 100, the selecting circuit 102 is arranged to output the master signal ml_ax according to the scan input SI, the first clock signal clk_nand, and the second clock signal clk_nor. When the scan enable signal SE is the low voltage level (e.g. the high voltage level may be Vgnd or close to Vgnd) in the normal operation mode of the flip-flop device 100, the selecting circuit 102 is arranged to output the master signal ml_ax according to the input data D, the first clock signal clk_nand, and the second clock signal clk_nor. According to some embodiments, the scan enable signal SE and the scan input SI may be omitted in the selecting circuit 102 such that the selecting circuit 102 only receive the input data D, the first clock signal clk_nand, the second clock signal clk_nor, and to output the master signal ml_ax according to the first clock signal clk_nand and the second clock signal clk_nor.

The gating circuit 104 is coupled to the selecting circuit 102, the master circuit 106, the slave writing circuit 108, and the slave circuit 110. The gating circuit 104 is arranged to generate the first clock signal clk_nand and the second clock signal clk_nor according to an input clock signal CP and the master signal ml_ax. More specifically, the gating circuit 104 is arranged to generate the first clock signal clk_nand with the first signal transition number and the second clock signal clk_nor with the second signal transition number in a specific period (e.g. writing mode and storing mode) of the input clock signal CP according to the master signal ml_ax, wherein the first signal transition number and the second signal transition number are not greater than the signal transition number of the input clock signal CP in the specific period. In other words, the gating circuit 104 is arranged to reduce the signal transition number of the input clock signal CP for generating the first clock signal clk_nand and the second clock signal clk_nor according to the master signal ml_ax.

According to some embodiments, the master circuit 106 is coupled to the selecting circuit 102 and the gating circuit 104. The master circuit 106 is arranged to maintain or hold the voltage level of the master signal ml_ax according to the first clock signal clk_nand and the second clock signal clk_nor during a first mode (e.g. a writing mode) of flip-flop device 100. More specifically, the master circuit 106 in combination with the gating circuit 104 are configured to be a feedback loop for holding the voltage level of the master signal ml_ax according to the first clock signal clk_nand and the second clock signal clk_nor during the first mode of flip-flop device 100.

The slave writing circuit 108 is coupled to the master circuit 106, the slave circuit 110, and the gating circuit 104. The slave writing circuit 108 is arranged to output the slave signal sl_ax to the slave circuit 110 according to the first clock signal clk_nand and the second clock signal clk_nor during a second mode (e.g. a storing mode) of flip-flop device 100.

The slave circuit 110 is coupled to the slave writing circuit 108 and the gating circuit 104. The slave circuit 110 is arranged to output the output data Q based on the value of the slave signal sl_ax (e.g. the inverse of the slave signal sl_ax). The slave circuit 110 is also arranged to latch the slave signal sl_ax according to the first clock signal clk_nand and the second clock signal clk_nor during the second mode (e.g. a writing mode) of flip-flop device 100.

According to some embodiments, a signal transition of a clock signal may be the situation when the voltage level of the signal is changed into the high voltage level from the low voltage level or when the voltage level of the signal is changed into the low voltage level from the high voltage level. When a circuit (e.g. an inverter) is controlled by a clock signal, a signal transition of the clock signal may toggle the inverter once. During the operation of a circuit device, more toggles occurring in the circuit elements of the circuit device may cause the circuit device to consume more power. In other words, a circuit controlled by a full-activity clock (i.e. more transitions in an operating period) may consume more power than a circuit controlled by a lower-activity clock (i.e. less transitions in the operating period). In the present embodiments, the input clock signal CP is the full-activity clock, and the first clock signal clk_nand and the second clock signal clk_nor are the lower-activity clock. The gating circuit 104 is arranged to convert the full-activity clock (i.e. the input clock signal CP) into the lower-activity clocks (i.e. the first clock signal clk_nand and the second clock signal clk_nor) according to the master signal ml_ax. For one example, the activity of each of the first clock signal clk_nand and the second clock signal clk_nor is a half of the activity of the input clock signal CP. For another example, when the master signal ml_ax is always high or always low, the activities of the first clock signal clk_nand and the second clock signal clk_nor may be statistically half of the activity of the input clock signal CP, i.e. one of the first clock signal clk_nand or the second clock signal clk_nor may have activity greater than 50% while the other may have activity lower than 50%. Therefore, when the selecting circuit 102, the master circuit 106, the slave writing circuit 108, and the slave circuit 110 are controlled by the first clock signal clk_nand and the second clock signal clk_nor, the total power consumption of the flip-flop device 100 may be reduced.

Figure 2A:
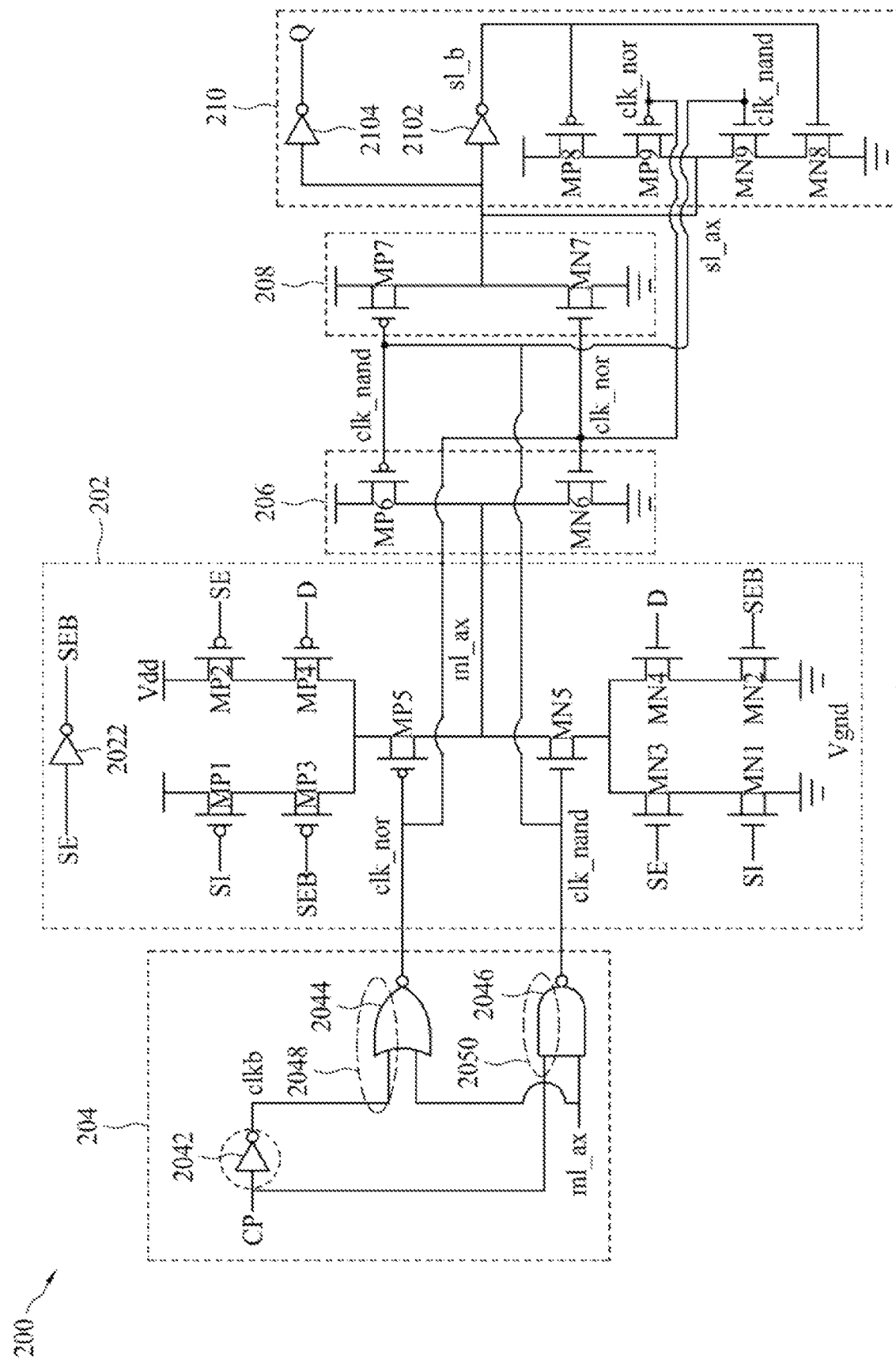
FIG. 2A is a diagram illustrating a flip-flop device in accordance with some embodiments.

FIG. 2A is a diagram illustrating a flip-flop device 200 in accordance with some embodiments. The flip-flop device 200 may be a schematic implementation of the scan flip-flop 100. For brevity, the signal labels of the flip-flop device 200 are similar to the signal labels of the flip-flop device 100. According to some embodiments, the present flip-flop device 200 comprises a selecting circuit 202, a gating circuit 204, a master circuit 206, a slave writing circuit 208, and a slave circuit 210. The functions of the selecting circuit 202, the gating circuit 204, the master circuit 206, the slave writing circuit 208, and the slave circuit 210 are similar to the functions of the selecting circuit 102, the gating circuit 104, the master circuit 106, the slave writing circuit 108, and the slave circuit 110 respectively, thus the detailed description is omitted here for brevity.

According to some embodiments, the selecting circuit 202 comprises a plurality of p-type field effected transistors MP1-MP5, a plurality of n-type field effected transistors MN1-MN5, and an inverter 2022. The inverter 2022 is arranged to invert the voltage level of the scan input signal SE to generate an inverted scan enable signal SEB. It is noted that a field effected transistor may comprise two connecting terminals (e.g. a source and a drain) and a control terminal (e.g. a gate). The sources of the transistors MP1 and MP2 are coupled to the supply voltage Vdd. The gates of the transistors MP1 and MP2 receive the scan input SI and the scan enable signal SE respectively. The sources of the transistors MP3 and MP4 are coupled to the drains of the transistors MP1 and MP2 respectively. The gates of the transistors MP3 and MP4 receive the inverted scan enable signal SEB and the input data D respectively. The source of the transistor MP5 is coupled to the drains of the transistors MP3 and MP4. The gate of the transistor MP5 receives the second clock signal clk_nor. The drain of the transistor MP5 outputs the master signal ml_ax. The sources of the transistors MN1 and MN2 are coupled to the ground voltage Vgnd. The gates of the transistors MN1 and MN2 receive the scan input SI and the inverted scan enable signal SEB respectively. The sources of the transistors MN3 and MN4 are coupled to the drains of the transistors MN1 and MN2 respectively. The gates of the transistors MN3 and MN4 receive the scan enable signal SE and the input data D respectively. The source of the transistor MN5 is coupled to the drains of the transistors MN3 and MN4. The gate of the transistor MN5 receives the first clock signal clk_nand. The drain of the transistor MN5 is coupled to the drain of the transistor MP5 for outputting the master signal ml_ax. It is noted that, the scan enable signal SE and the scan input SI may be omitted in the selecting circuit 202. When the scan enable signal SE and the scan input SI are omitted in the selecting circuit 202, the circuits related to the scan portion (i.e. MP1, MP2, MP3, MN1, MN2, MN3, and 2022) may also be omitted in the selecting circuit 202.

The gating circuit 204 comprises an inverter 2042, a NOR gate 2044, and a NAND gate 2046. The inverter 2042 receives the input clock signal CP for outputting an inverted clock signal clkb. A first input terminal and a second input terminal of the NOR gate 2044 receives the inverted clock signal clkb and the master signal ml_ax respectively. The output terminal of the NOR gate 2044 outputs the second clock signal clk_nor. A first input terminal and a second input terminal of the NAND gate 2046 receives the input clock signal CP and the master signal ml_ax respectively. The output terminal of the NAND gate 2046 outputs the first clock signal clk_nand.

The master circuit 206 comprises a p-type field effected transistor MP6 and an n-type field effected transistors MN6. The slave writing circuit 208 comprises a p-type field effected transistor MP7 and an n-type field effected transistors MN7. The sources of the transistor MP6 and MP7 are coupled to the supply voltage Vdd. The sources of the transistor MN6 and MN7 are coupled to the ground voltage Vgnd. The gate of the transistor MP6 is coupled to the gate of the transistor MP7 for receiving the first clock signal clk_nand. The gate of the transistor MN6 is coupled to the gate of the transistor MN7 for receiving the second clock signal clk_nor. The drain of the transistor MP6 is coupled to the drain of the transistor MN6 and the drain of the transistor MP5. The drain of the transistor MP7 is coupled to the drain of the transistor MN7 for outputting the slave signal sl_ax.

The slave circuit 210 comprises a first inverter 2102, a plurality of p-type field effected transistors MP8 and MP9, a plurality of n-type field effected transistors MN8 and MN9, and a second inverter 2104. The inverter 2102 is arranged to receive the slave signal sl_ax to generate an inverted slave signal sl_b. The inverter 2104 is arranged to receive the slave signal sl_ax to generate the output data Q. The source of the transistor MP8 is coupled to the supply voltage Vdd, and the gate of the transistor MP8 is coupled to the output terminal of the inverter 2102 for receiving the inverted slave signal sl_b. The source of the transistor MP9 is coupled to the drain of the transistor MP8, and the gate of the transistor MP9 receives the second clock signal clk_nor. The source of the transistor MN8 is coupled to the ground voltage Vgnd, and the gate of the transistor MN8 is coupled to the output terminal of the inverter 2102 for receiving the inverted slave signal sl_b. The source of the transistor MN9 is coupled to the drain of the transistor MN8, and the gate of the transistor MN9 receives the first clock signal clk_nand. The drain of the transistor MP9 is coupled to the drain of the transistor MN9 and the drain of the transistor MP7 for receiving the slave signal sl_ax.

According to some embodiments, the activity of each of the first clock signal clk_nand and the second clock signal clk_nor is a half of the activity of the input clock signal CP. As shown in FIG. 2A, eight transistors (i.e. MN5, MP6, MP7, MN9, MP5, MN6, MN7, MP9) are controlled by the half-activity clock signals (i.e. the first clock signal clk_nand and the second clock signal clk_nor), and six transistors (i.e. two transistors in the inverter 2042, two transistors in the portion 2048 of the NOR gate 2044 that receives the inverted clock signal clkb, and two transistors in the portion 2050 of the NAND gate 2046 that receives the input clock signal CP) in the gating circuit 204 are controlled by the full-activity clock signal (i.e. the input clock signal CP). For dynamic power, the eight transistors controlled by the half-activity clock signal may effectively be four transistors controlled by the full-activity clock signal. Effectively, a total of 10 transistors are controlled by the full-activity clock signal in the flip-flop device 200. In comparison to the conventional flip-flop without using the gating circuit 204, the conventional flip-flop may have 12 transistors controlled by the full-activity clock signal. Accordingly, by using the gating circuit 204, the number of devices toggled by the full-activity clock signal is reduced, and the total power consumption of the flip-flop device 200 is also reduced.

Please refer to FIG. 2A again, during the writing mode of the flip-flop device 200, for the gating circuit 204, the voltage level of the input clock signal CP is the low voltage level (i.e. CP=0), and the voltage levels of the first clock signal clk_nand and the second clock signal clk_nor are the high voltage level and the low voltage level respectively (i.e. clk_nand=1 and clk_nor=0). When clk_nand=1 and clk_nor=0, the connection of the master circuit 206 is opened, and the input data D may be written to the drain of the transistor MP6 (the drain of the transistor MN6) to be the master signal ml_ax. Meanwhile, the connection of the slave circuit 210 is closed to retain the current data or value therein, and the slave circuit 210 may not be written by the slave writing circuit 208.

During the storing mode of the flip-flop device 200, for the gating circuit 204, the voltage level of the input clock signal CP is the high voltage level (i.e. CP=1), and the voltage levels of the first clock signal clk_nand and the second clock signal clk_nor are equal to the inverted signal of the master signal ml_ax (i.e. clk_nand=clk_nor=!(ml_ax). When clk_nand=clk_nor=!(ml_ax), the connection of the selecting circuit 202 is closed, the master circuit 206 retains the current value on the drain of the transistor MP6 as well as the drain of the transistor MN6 (i.e. the master signal ml_ax), and the current input data D may not be written to the drain of the transistor MP6. Meanwhile, the connection of the slave circuit 210 is opened, and the slave writing circuit 208 may write the value of the master signal ml_ax into the slave circuit 210. It is noted that, during the storing mode, the selecting circuit 202 may be half closed to save power. When the selecting circuit 202 is half closed, the selecting circuit 202 may not overwrite the value of master signal ml_ax with the opposite value, but the selecting circuit 202 may write the same value again (i.e. not changing the value).

The following table 1 illustrates the truth table of the voltage levels of the input clock signal CP, the inverted clock signal clkb, the input data D, the master signal ml_ax, the first clock signal clk_nand, and the second clock signal clk_nor of the flip-flop device 200:

| Mode | CP | clkb | D | ml_ax | clk_nand input | clk_nand output | clk_nand comment | clk_nor input | clk_nor output | clk_nor comment |
|---|---|---|---|---|---|---|---|---|---|---|
| First mode | 0 | 1 | 0 | 1 | CP ml_ax | 1 | Forced to 1 by CP | clkb ml_ax | 0 | Forced to 0 by clkb |
|  | 0 | 1 | 1 | 0 | CP ml_ax | 1 | Forced to 1 by CP | clkb ml_ax | 0 | Forced to 0 by clkb |
| Second mode | 1 | 0 | X | 0 | CP ml_ax | 1 | !(ml_ax) | clkb ml_ax | 1 | !(ml_ax) |
|  | 1 | 0 | X | 1 | CP ml_ax | 0 | !(ml_ax) | clkb ml_ax | 0 | !(ml_ax) |

Figure 2B:
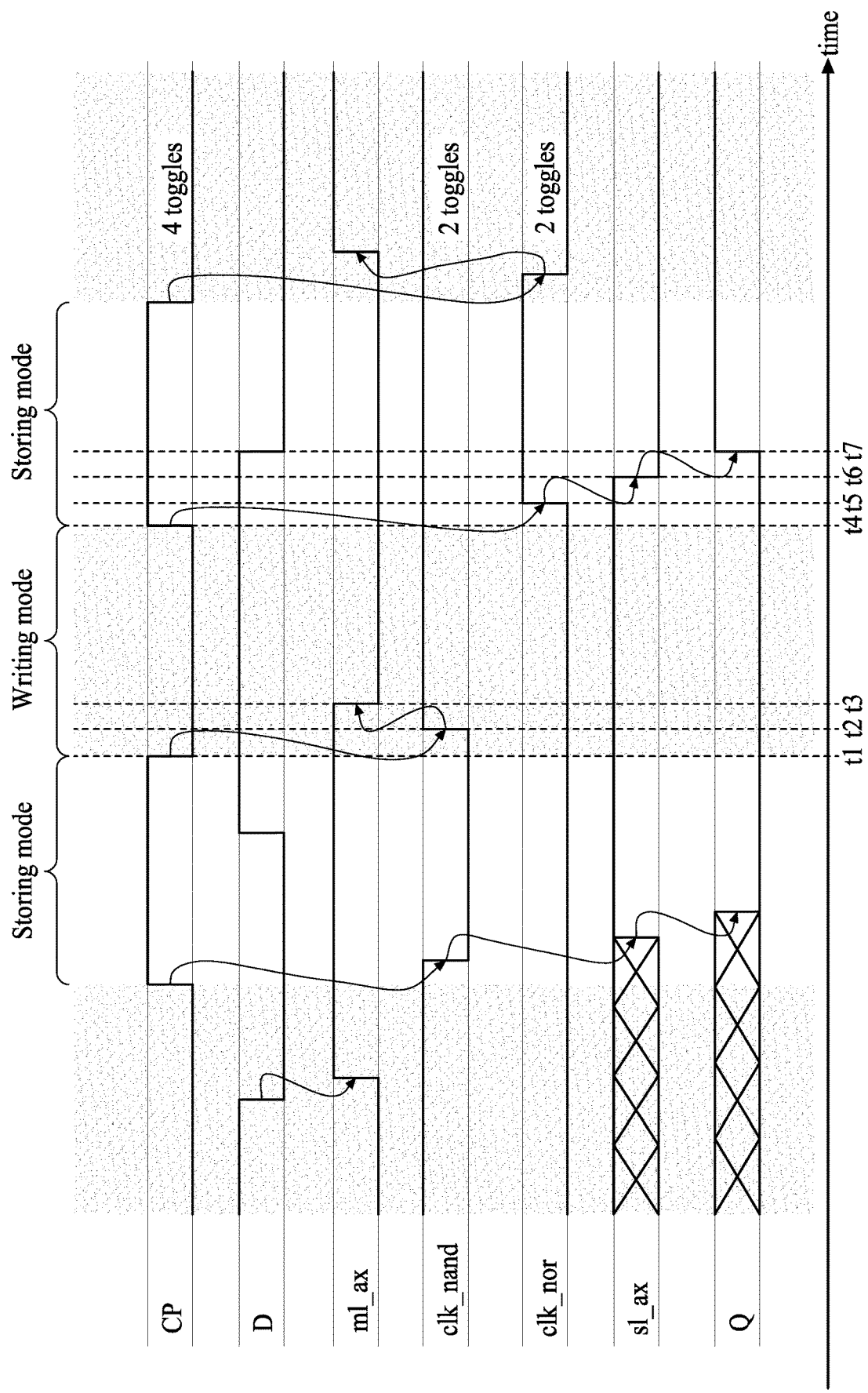
FIG. 2B is a timing diagram illustrating the signal variation of a flip-flop device in accordance with some embodiments.

FIG. 2B is a timing diagram illustrating the input clock signal CP, the input data D, the master signal ml_ax, the first clock signal clk_nand, the second clock signal clk_nor, the slave signal sl_ax, and the output data Q during the writing and storing modes of the flip-flop device 200 in accordance with some embodiments. In this example, it is assumed that the scan enable signal SE is the low voltage level (i.e. SE=0), and the scan input SI may be ignored. At time t1, the voltage level of the input clock signal CP is changed to the low voltage level to enter the writing mode. Then, the voltage level of the first clock signal clk_nand is changed to the high voltage level at time t2 to open the master circuit 206. More specifically, the high voltage level of the first clock signal clk_nand is arranged to open the transistor MN5 of the selecting circuit 202 for writing to the master signal ml_ax, and to close the feedback loop through the transistor MP6 of the master circuit 206 which had held the previous value of the master signal ml_ax. Then, the voltage level of the master signal ml_ax, which corresponds to the input data D, is changed to the low voltage level at time t3. In other words, the input data D is written into the master circuit 206 at time t3.

At time t4, the voltage level of the input clock signal CP is changed to the high voltage level to enter the storing mode. Then, the voltage level of the second clock signal clk_nor is changed to the high voltage level at time t5 to open the slave circuit 210 and to turn on the slave writing circuit 208 to begin the writing of the slave signal sl_ax. Then, the voltage level of the slave signal sl_ax, which corresponds to the previous input data D, is changed to the low voltage level at time t6. Then, the voltage level of the output data Q is changed to the high voltage level at time t7.

According to FIG. 2B, the toggling number (e.g. 2 toggles) of the first clock signal clk_nand and the second clock signal clk_nor is a half of the toggling number (e.g. 4 toggles) of the input clock signal CP. Accordingly, by using the gating circuit 204, the power consumption of the devices toggled by the first clock signal clk_nand and the second clock signal clk_nor may be reduced.

Figure 3:
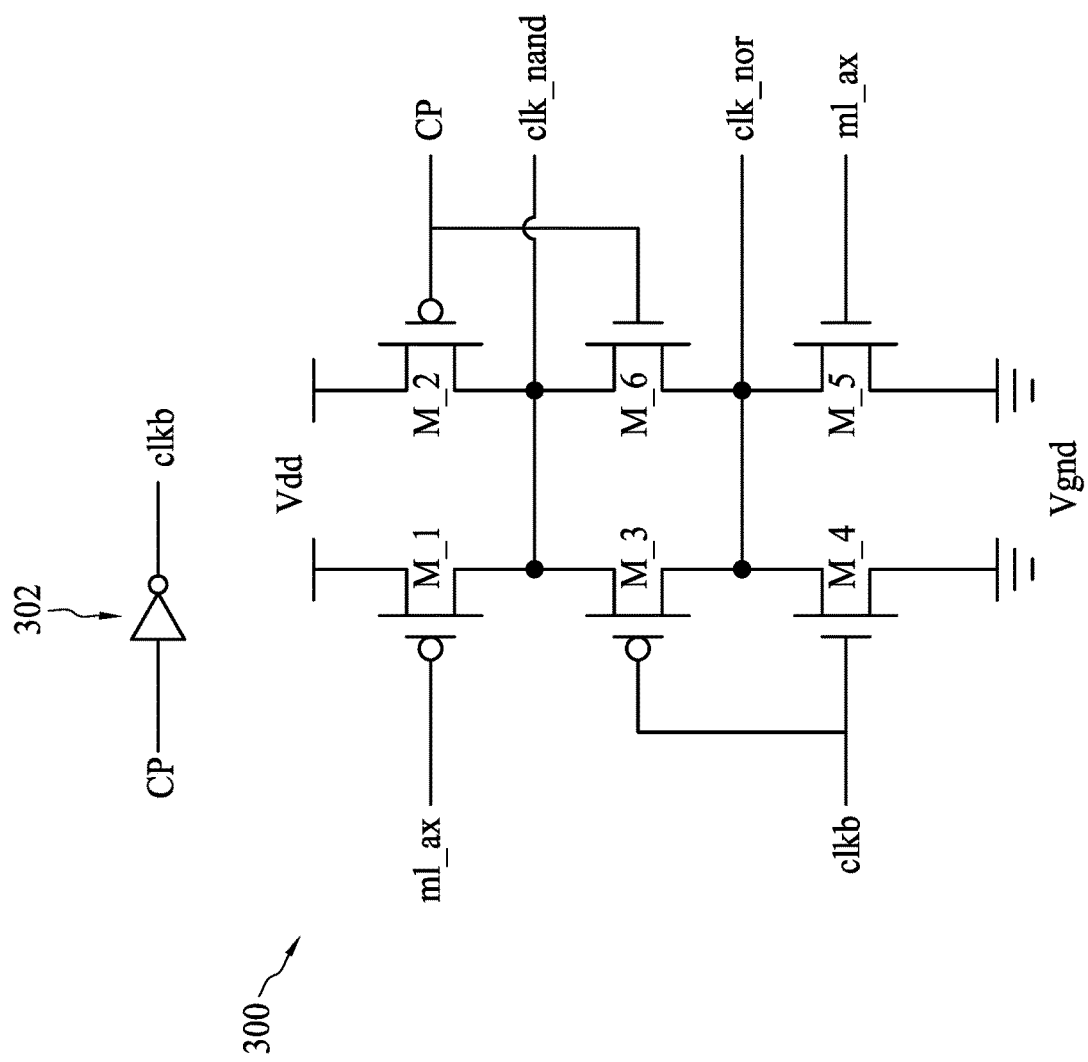
FIG. 3 is a diagram illustrating a gating circuit in accordance with some embodiments.

According to the gating circuit 204 of FIG. 2A, the gating circuit 204 is comprised of ten transistors, wherein the inverter 2042 comprises two transistors, the NOR gate 2044 comprises four transistors, and the NAND gate 2046 comprises four transistors. However, this is not a limitation of the present embodiments. FIG. 3 is a diagram illustrating a gating circuit 300 in accordance with some embodiments. The gating circuit 300 comprises a first inverter 302 and a plurality of transistors M_1-M_6, wherein the transistor M_1-M_3 are p-type field effected transistor and the transistor M_4-M_6 are n-type field effected transistor. The inverter 302 receives the input clock signal CP for outputting an inverted clock signal clkb. The sources of the transistors M_1 and M_2 are coupled to the supply voltage Vdd. The gates of the transistors M_1 and M_2 receive the master signal ml_ax and the input clock signal CP respectively. The drains of the transistor M_1 and M_2 are coupled to the source of the transistor M_3 and the drain of the transistor M_6 respectively. The drains of the transistor M_1 and M_2 are arranged to output the first clock signal clk_nand. The gate of the transistor M_3 receives the inverted clock signal clkb. The sources of the transistors M_4 and M_5 are coupled to the ground voltage Vgnd. The gates of the transistors M_4 and M_5 receive the inverted clock signal clkb and the master signal ml_ax respectively. The drains of the transistor M_4 and M_5 are coupled to the drain of the transistor M_3 and the source of the transistor M_6 respectively. The drains of the transistor M_4 and M_5 are arranged to output the second clock signal clk_nor. The gate of the transistor M_6 receives the input clock signal CP.

As shown in FIG. 3, the total number of transistor in the gating circuit 300 is 8 (i.e. two transistors in the inverter 302, and M_1-M_6), and the total of six transistors (i.e. the invertor 302, M_2, M_3, M_4, M_6) in the gating circuit 300 are controlled by the full-activity clock signal (i.e. the input clock signal CP or the inverted clock signal clkb). In addition, the loading of the master signal ml_ax in the gating circuit 300 is reduced. Consequently, the setup time of the master signal ml_ax in the gating circuit 300 is improved.

Figure 4:
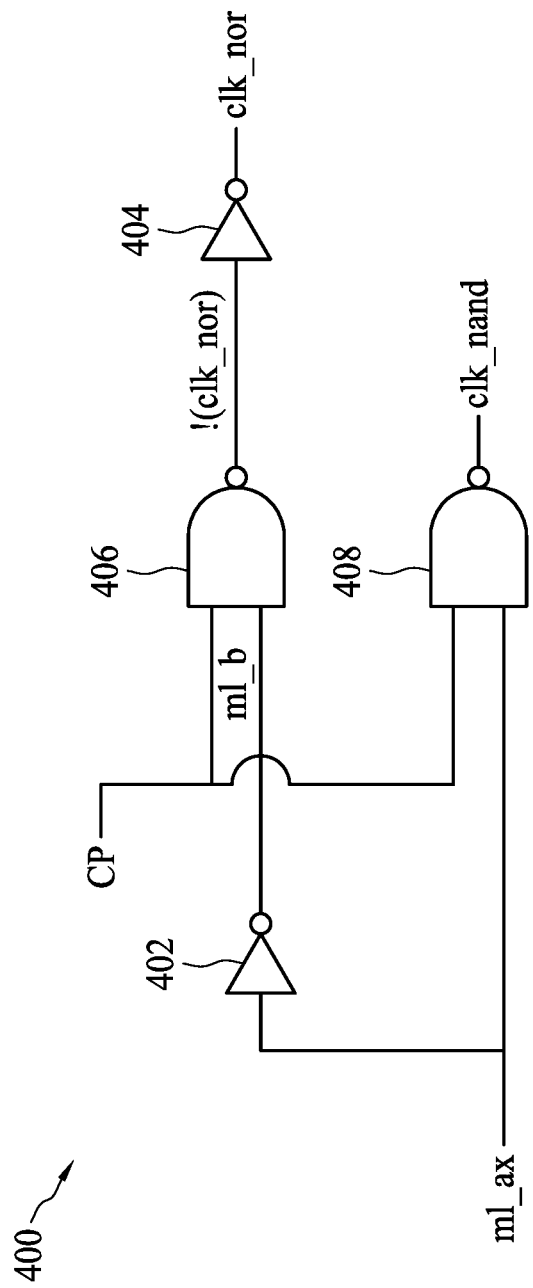
FIG. 4 is a diagram illustrating a gating circuit in accordance with some embodiments.
Figure 5:
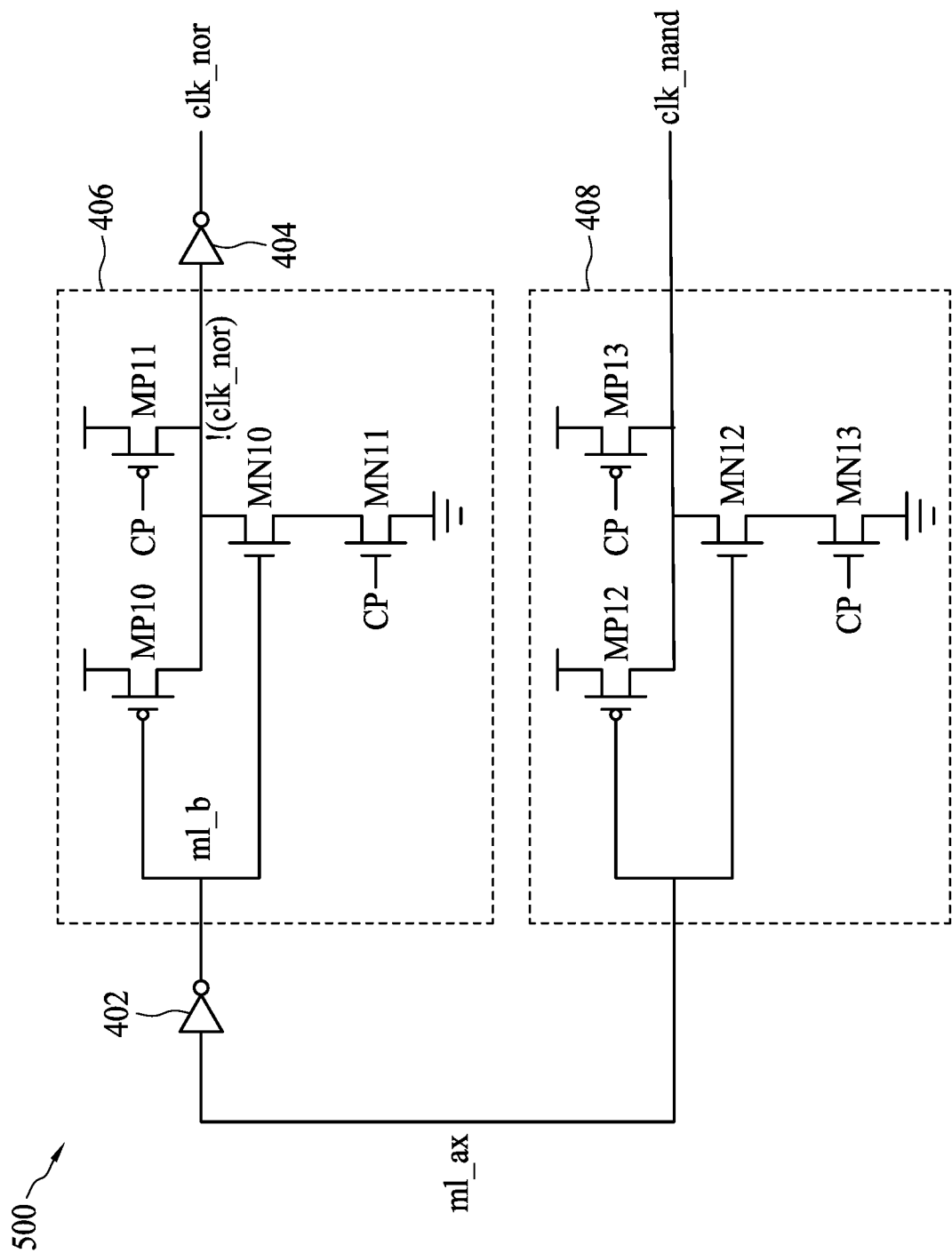
FIG. 5 is a schematic diagram illustrating a gating circuit in accordance with some embodiments.

As mentioned above, there are six transistors in the gating circuit 204 or 300 controlled by the input clock signal CP or clkb (i.e. the full-activity clock signal). However, this is not a limitation of the present embodiments. The number of full activity transistors in the gating circuit 204 can be further reduced in FIG. 4. FIG. 4 is a diagram illustrating a gating circuit 400 in accordance with some embodiments. The gating circuit 400 comprises a first inverter 402, a second inverter 404, a first NAND gate 406, and a second NAND gate 408. FIG. 5 is a schematic diagram illustrating a gating circuit 400 in accordance with some embodiments. The gating circuit 500 may be a schematic implementation of the gating circuit 400. For brevity, the numerals of the gating circuit 500 is similar to the numerals of the gating circuit 400. According to some embodiments, the inverter 402 is arranged to receive the master signal ml_ax for generating an inverted master signal ml_b. The NAND gate 406 is arranged to generate a clock signal !(clk_nor) according to the inverted master signal ml_b and the input clock signal CP. The inverter 404 is arranged to receive the clock signal !(clk_nor) for generating the second clock signal clk_nor. The NAND gate 408 is arranged to generate the first clock signal clk_nand according to the master signal ml_ax and the input clock signal CP.

According to some embodiments, as shown in FIG. 5, the NAND gate 406 comprises a plurality of p-type field effected transistors MP10 and MP11, and a plurality of n-type field effected transistors MN10 and MN11. The sources of the transistors MP10 and MP11 are coupled to the supply voltage Vdd. The gates of the transistors MP10 and MP11 receive the inverted master signal ml_b and the input clock signal CP respectively. The drain of the transistor MP10 is coupled to the drain of the transistor MP1l for outputting a clock signal !(clk_nor). The drain of the transistor MN10 is coupled to the drain of the transistor MP10. The gate of the transistor MN10 receives the inverted master signal ml_b. The drain of the transistor MN11 is coupled to the source of the transistor MN10. The gate of the transistor MN10 receives the input clock signal CP. The source of the transistor MN10 is coupled to the ground voltage Vgnd. The inverter 402 is arranged to invert the clock signal !(clk_nor) to generate the second clock signal clk_nor.

In addition, the NAND gate 408 comprises a plurality of p-type field effected transistors MP12 and MP13, and a plurality of n-type field effected transistors MN12 and MN13. The sources of the transistors MP12 and MP13 are coupled to the supply voltage Vdd. The gates of the transistors MP12 and MP13 receive the master signal ml_ax and the input clock signal CP respectively. The drain of the transistor MP12 is coupled to the drain of the transistor MP12 for outputting the first clock signal clk_nand. The drain of the transistor MN12 is coupled to the drain of the transistor MP12. The gate of the transistor MN12 receives the master signal ml_ax. The drain of the transistor MN13 is coupled to the source of the transistor MN12. The gate of the transistor MN13 receives the input clock signal CP. The source of the transistor MN13 is coupled to the ground voltage Vgnd.

As shown in FIG. 5, four transistors (i.e. MP11, MN11, MP13, MN13) are controlled by the full-activity clock signal (i.e. the input clock signal CP), and two transistors (i.e. a p-type field effected transistor and an n-type field effected transistor of the inverter 404) are controlled by the half-activity clock signal (i.e. the clock signal !(clk_nor)). Effectively, there are five transistors in the gating circuit 500 that are full-activity transistor. Therefore, the power consumption of the gating circuit 500 is smaller than the power consumption of the gating circuit 204.

Figure 6:
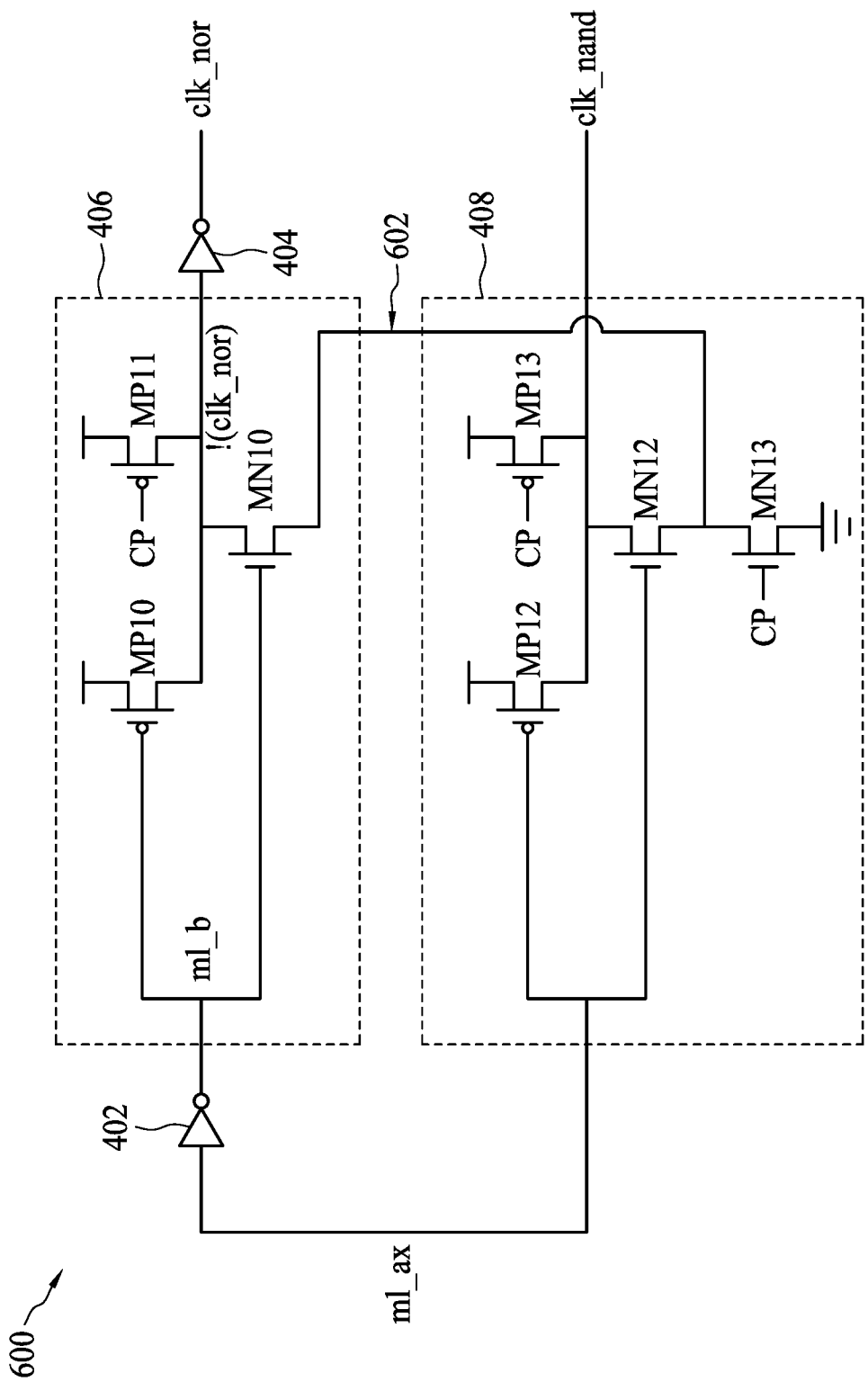
FIG. 6 is a schematic diagram illustrating a gating circuit in accordance with some embodiments.

To further reduce number of full-activity transistors of the gating circuit 500, another embodiment of gating circuit is presented in FIG. 6. FIG. 6 is a schematic diagram illustrating a gating circuit 600 in accordance with some embodiments. The gating circuit 600 may be another schematic implementation of the gating circuit 400. For brevity, the numerals of the gating circuit 600 is similar to the numerals of the gating circuit 400. In comparison to the gating circuit 500, the transistor MN11 in the gating circuit 500 is eliminated in the gating circuit 600. More specifically, as the gates of the transistors MN11 and MN13 are coupled to the input clock signal CP, the sources of the transistors MN11 and MN13 are coupled to the ground voltage Vgnd, and the drains of the transistors MN11 and MN13 are coupled to the sources of the transistors MN10 and MN12 respectively, the transistors MN11 and MN13 may be combined into or replaced with a single transistor (i.e. MN13). Moreover, as the transistor MN11 is eliminated, a connection path 602 may be arranged to connect the drain of the transistor MN13 from the source of the transistor MN10.

As shown in FIG. 6, three transistors (i.e. MP11, MP13, MN13) are controlled by the full-activity clock signal (i.e. the input clock signal CP), and two transistors (i.e. a p-type field effected transistor and an n-type field effected transistor of the inverter 404) are controlled by the half-activity clock signal (i.e. the clock signal !(clk_nor)). Effectively, there have four transistors in the gating circuit 600 are full-activity transistor. Therefore, the power consumption of the gating circuit 600 is smaller than the power consumption of the gating circuit 500.

Figure 7:
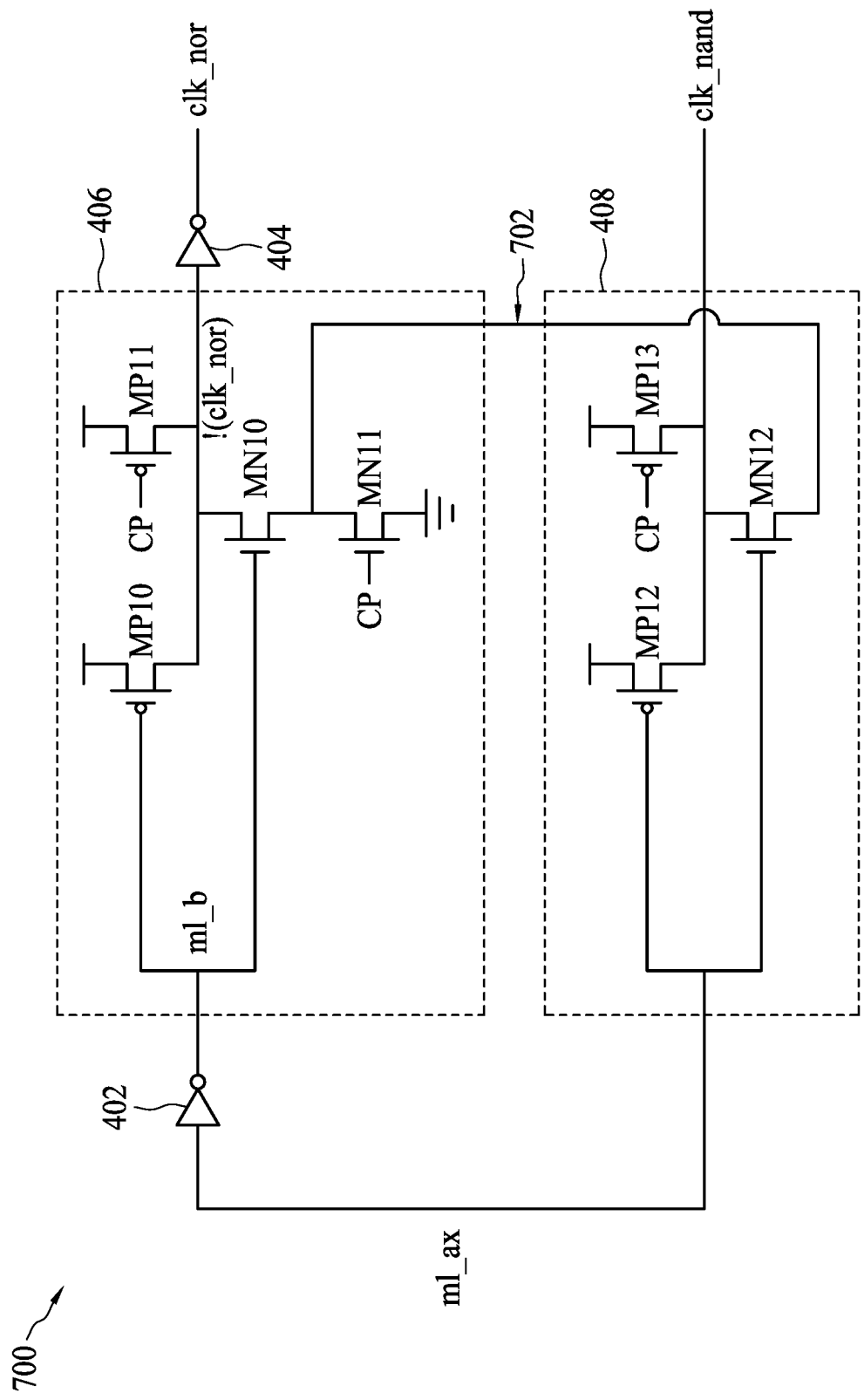
FIG. 7 is a schematic diagram illustrating a gating circuit in accordance with some embodiments.

In another embodiment, the transistor MN13 of the gating circuit 500 may be eliminated and the transistor MN11 of the gating circuit 500 may be kept in a gating circuit as shown in FIG. 7. FIG. 7 is a schematic diagram illustrating a gating circuit 700 in accordance with some embodiments. The gating circuit 700 may be another schematic implementation of the gating circuit 400. For brevity, the numerals of the gating circuit 700 is similar to the numerals of the gating circuit 400. In comparison to the gating circuit 500, the transistor MN13 in the gating circuit 500 is eliminated in the gating circuit 700. More specifically, the transistors MN11 and MN13 are combined into or replaced with a single transistor (i.e. MN11). As the transistor MN13 is eliminated, a connection path 702 may be arranged to connect the drain of the transistor MN11 from the source of the transistor MN12.

Similar to the reason of the gating circuit 600, there have four transistors in the gating circuit 700 are full-activity transistor effectively. Therefore, the power consumption of the gating circuit 700 is smaller than the power consumption of the gating circuit 500.

In addition, to further reduce the power consumption of the flip-flop device using the gating circuit 700, when the voltage level of the next input data D is equal to the voltage level of the current output data Q (i.e. D=Q), the input clock signal CP may not toggle the selecting circuit (e.g. 202) and the master circuit (e.g. 206) to rewrite the same value into the master circuit. More specifically, as mentioned above, normally, when the input clock signal CP is changed to the low voltage level (i.e. CP=0), the voltage level of the first clock signal clk_nand and the second clock signal clk_nor are the high voltage level and the low voltage level respectively (i.e. clk_nand=1 and clk_nor=0) to open the master circuit 206. Therefore, when the voltage levels of the input data D and the output data Q are the high voltage level (i.e. D=Q=1), the voltage level of the first clock signal clk_nand may not transit as the voltage level of the first clock signal clk_nand is already in the high voltage level. Moreover, when D=Q=1, the voltage level of the second clock signal clk_nor may not be changed/toggled to the low voltage level (i.e. the voltage level of the second clock signal clk_nor may be kept on the high voltage level).

In addition, when the voltage levels of the input data D and the output data Q are the low voltage level (i.e. D=Q=0), the voltage level of the second clock signal clk_nor may not transit as the second clock signal clk_nor is already in the low voltage level. Moreover, when D=Q=0, the voltage level of the first clock signal clk_nand may not be changed/toggled to the high voltage level (i.e. the voltage level of the first clock signal clk_nand may be kept on the low voltage level) for saving power.

Figure 8:
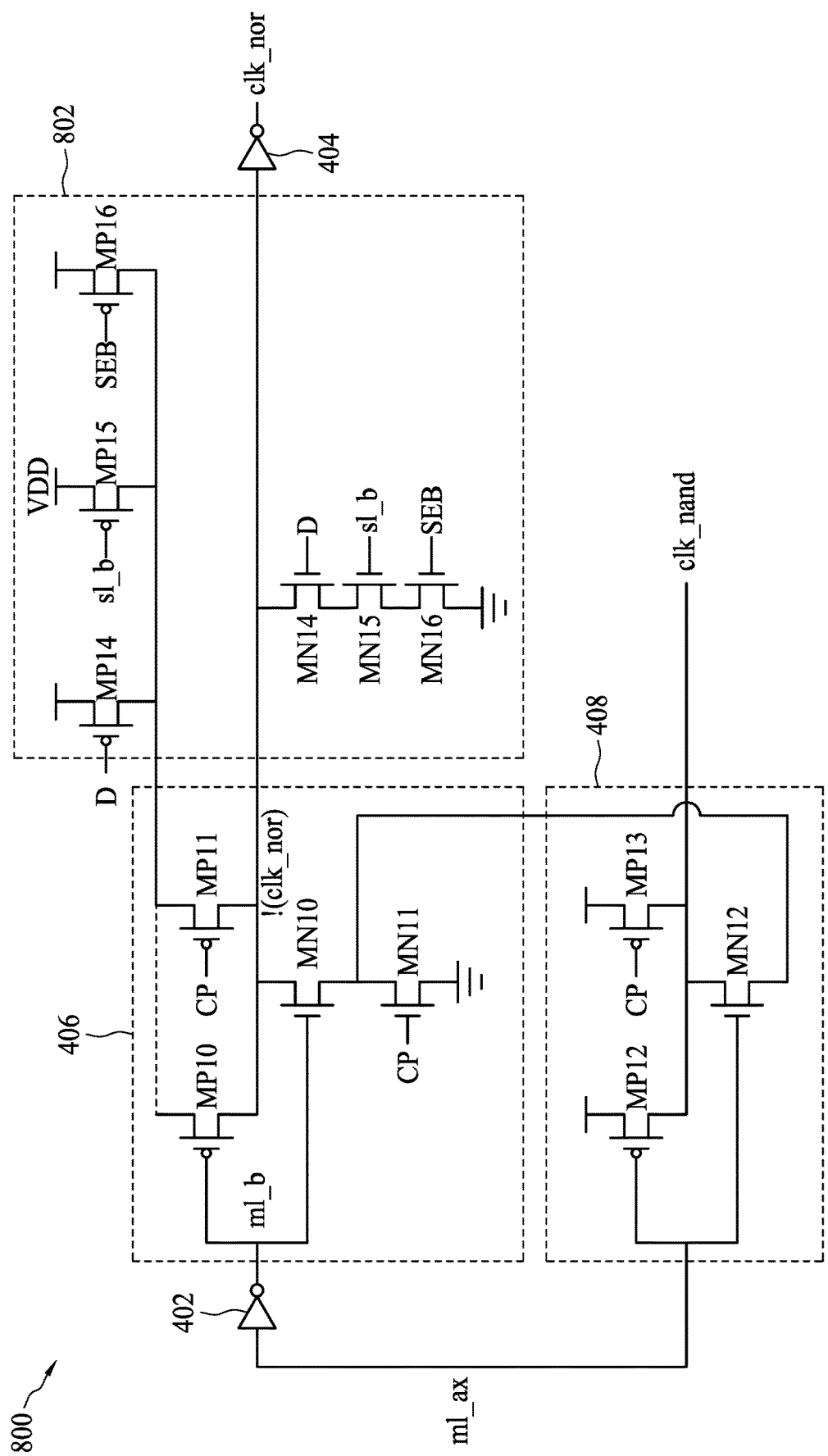
FIG. 8 is a schematic diagram illustrating a gating circuit in accordance with some embodiments.

Accordingly, a gating circuit gated by the input data D is presented in FIG. 8. FIG. 8 is a schematic diagram illustrating a gating circuit 800 in accordance with some embodiments. The gating circuit 800 is a data-driven clock gating (DDCG) circuit. The gating circuit 800 may be another schematic implementation of the gating circuit 400. For brevity, the numerals of the gating circuit 800 is similar to the numerals of the gating circuit 700. In comparison to the gating circuit 700, the gating circuit 800 further comprises a data gating circuit 802. The data gating circuit 802 is coupled to the NAND gate 406 for gating the second clock signal clk_nor according to the input data D. More specifically, the data gating circuit 802 is arranged to maintain the voltage level of the second clock signal clk_nor on the high voltage level such that the voltage level of the second clock signal clk_nor may not be changed/toggled to the low voltage level when D=Q=1.

According to some embodiments, the data gating circuit 802 comprises a plurality of p-type field effected transistors MP14-MP16 and a plurality of n-type field effected transistors MN14-MN16. The drains of the transistors MP14-MP16 are coupled to the supply voltage Vdd. The gates of the transistors MP14-MP16 are coupled to the input data D, the inverted slave signal sl_b, and the inverted scan enable signal SEB respectively. The sources of the transistors MP14-MP16 are coupled to the source of the transistor MP11.

In addition, the gates of the transistors MN14-MN16 are coupled to the input data D, the inverted slave signal sl_b, and the inverted scan enable signal SEB respectively. The drain of the transistor MN14 is coupled to the drain of the transistor MN10. The drain of the transistor MN15 is coupled to the source of the transistor MN14. The drain of the transistor MN16 is coupled to the source of the transistor MN15. The source of the transistor MN16 is coupled to the ground voltage Vgnd.

As shown in FIG. 8 and FIG. 2A, when D=Q=sl_b=SEB=1, the transistors MN14, MN15, and MN16 are arranged to force the voltage level of the clock signal !(clk_nor) to be the low voltage level or to force the voltage level of the second clock signal clk_nor to be the high voltage level (e.g. Vdd or close to Vdd). Accordingly, the data gating circuit 802 may maintain the voltage level of the second clock signal clk_nor on the high voltage level such that the voltage level of the second clock signal clk_nor may not be toggled to the low voltage level when D=Q=1.

It is noted that the source of the transistor MP10 may be coupled to the supply voltage Vdd or to the source of the transistor MP11, which is represented by the dashed line between the source of the transistor MP10 and the source of the transistor MP11.

Figure 9:
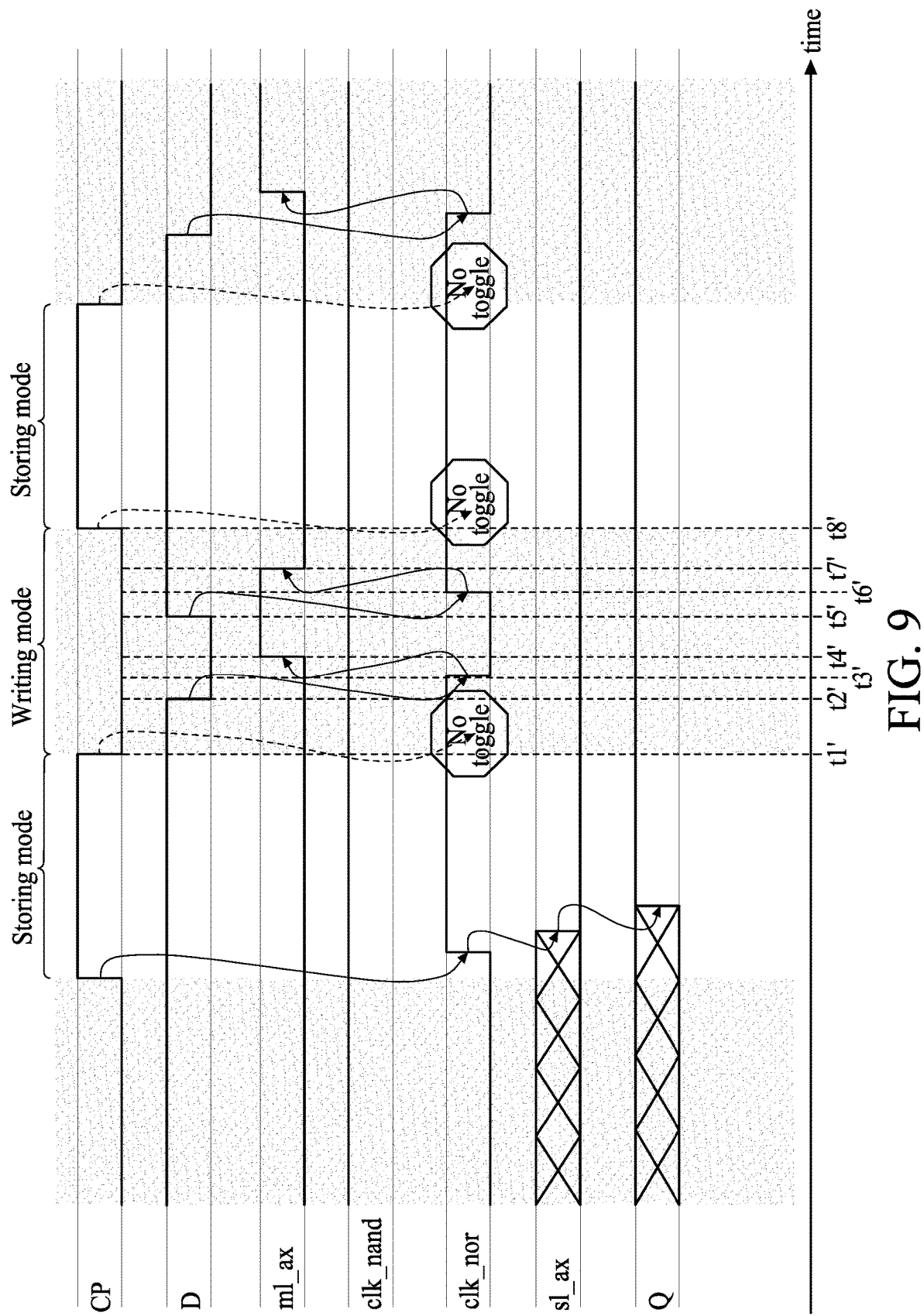
FIG. 9 is a timing diagram illustrating the signal variation of a flip-flop device with a gating circuit accordance with some embodiments.

FIG. 9 is a timing diagram illustrating the input clock signal CP, the input data D, the master signal ml_ax, the first clock signal clk_nand, the second clock signal clk_nor, the slave signal sl_ax, and the output data Q during the writing and storing modes of the flip-flop device 200 applying the gating circuit 800 accordance with some embodiments. In this example, it is assumed that the scan enable signal SE is the low voltage level (i.e. SE=0), and the scan input SI may be ignored. At time t1', the voltage level of the input clock signal CP is changed to the low voltage level to enter the writing mode. However, the voltage level of the second clock signal clk_nor is not changed or toggled to the high voltage level in response to the transition of the input clock signal CP. On the other hands, at time t8', the voltage level of the input clock signal CP is changed to the high voltage level to enter the storing mode. However, the voltage level of the second clock signal clk_nor is not changed or toggled to the low voltage level in response to the transition of the input clock signal CP. As the toggling number of the second clock signal clk_nor is reduced, the power consumption of the flip-flop device 200 is also reduced. More specifically, as shown in FIG. 2A and FIG. 8, the transistors MP5, MN6, MN7, and MP9, and the inverter 404 are controlled by the second clock signal clk_nor as well as the clock signal !(clk_nor) respectively, in which the toggling number of the second clock signal clk_nor is depended on the activity of the input data D. The more situations of D=Q=1 occurred in the input data D, the less power consumed by the transistors MP5, MN6, MN7, and MP9, and the two transistors in the inverter 404. For example, when 20% of the activity of the input data D is D=Q=1, the six transistors may represent 0.6 effective clock device controlled by the full-activity clock signal. Therefore, by using the data gating circuit 802, the number of effective full-activity transistors may be reduced to 5.6 from 8.

Moreover, during the writing mode, when the voltage level of the input data D is changed to the low voltage level at time t2', the voltage level of the second clock signal clk_nor is also changed to the low voltage level in response to the transition of the input data D at time t3'. Then, at time t4', the master signal ml_ax is changed to the high voltage level in response to the transition of the he second clock signal clk_nor. When the voltage level of the input data D is changed to the high voltage level at time t5', the voltage level of the second clock signal clk_nor is also changed to the high voltage level in response to the transition of the input data D at time t6'. Then, at time t7, the master signal ml_ax is changed to the low voltage level in response to the transition of the he second clock signal clk_nor. In other words, by using the data gating circuit 802, if a pulse occurs in the input data D during the writing mode, the pulse may not change or break the logic or value stored in the slave circuit 210. However, if a transition occurs in the input data D during the writing mode, the second clock signal clk_nor gated by the data gating circuit 802 need to switch appropriately to allow new value of input data D to be written to the master circuit (e.g. 206). It is noted that, during the writing mode, the new value of the input data D may not affect the value in the slave circuit 210.

Figure 10:
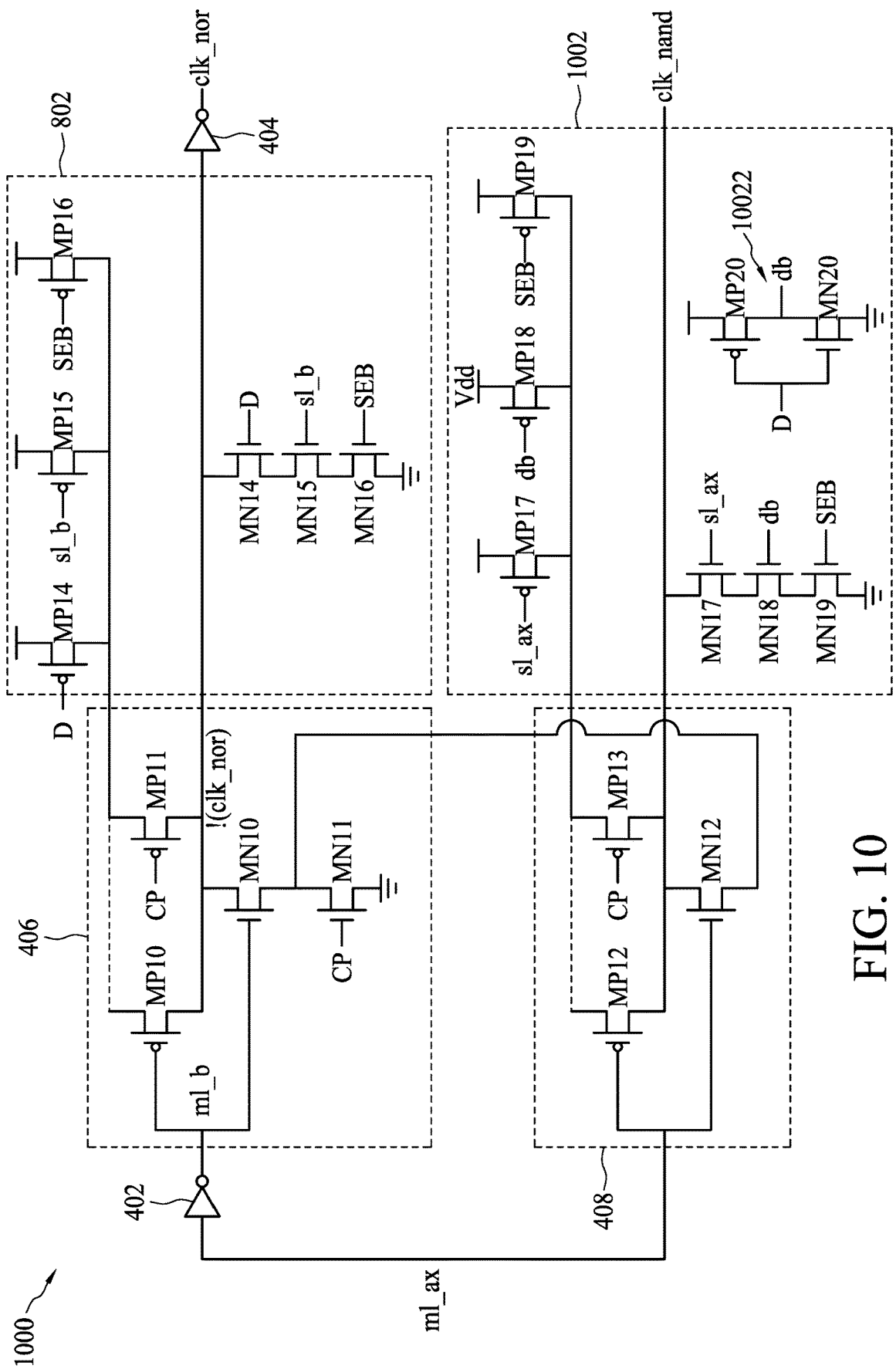
FIG. 10 is a schematic diagram illustrating a gating circuit in accordance with some embodiments.

FIG. 10 is a schematic diagram illustrating a gating circuit 1000 in accordance with some embodiments. The gating circuit 1000 is a data-driven clock gating (DDCG) circuit. The gating circuit 1000 may be another schematic implementation of the gating circuit 400. For brevity, the numerals of the gating circuit 1000 is similar to the numerals of the gating circuit 800. In comparison to the gating circuit 800, the gating circuit 1000 further comprises a data gating circuit 1002. The data gating circuit 1002 is coupled to the NAND gate 408 for gating the first clock signal clk_nand according to the input data D. More specifically, the data gating circuit 1002 is arranged to maintain the voltage level of the first clock signal clk_nand on the low voltage level such that the voltage level of the first clock signal clk_nand may not be changed/toggled to the high voltage level when D=Q=0.

The data gating circuit 1002 comprises an inverter 10022, a plurality of p-type field effected transistors MP17-MP19 and a plurality of n-type field effected transistors MN17-MN19. The inverter 10022 comprises a p-type field effected transistor MP20 and an n-type field effected transistors MN20, for inverting the input data D into an inverted data db. The drains of the transistors MP17-MP19 are coupled to the supply voltage Vdd. The gates of the transistors MP17-MP19 are coupled to the slave signal sl_ax, the inverted data db, and the inverted scan enable signal SEB respectively. The sources of the transistors MP17-MP19 are coupled to the source of the transistor MP13.

In addition, the gates of the transistors MN17-MN19 are coupled to the slave signal sl_ax, the inverted data db, and the inverted scan enable signal SEB respectively. The drain of the transistor MN17 is coupled to the drain of the transistor MN12. The drain of the transistor MN18 is coupled to the source of the transistor MN17. The drain of the transistor MN19 is coupled to the source of the transistor MN18. The source of the transistor MN19 is coupled to the ground voltage Vgnd.

It is noted that the source of the transistor MP12 may be coupled to the supply voltage Vdd or to the source of the transistor MP13, which is represented by the dashed line between the source of the transistor MP12 and the source of the transistor MP13.

As shown in FIG. 10 and FIG. 2A, when D=Q=0, sl_ax=db=SEB=1, the transistors MN17, MN18, and MN19 are arranged to force the voltage level of the first clock signal clk_nand to be the low voltage level. Accordingly, the data gating circuit 1002 may maintain the voltage level of the first clock signal clk_nand on the low voltage level (e.g. Vgnd or close to Vgnd) such that the voltage level of the first clock signal clk_nand may not be toggled to the high voltage level when D=Q=0. The operation of the data gating circuit 1002 is similar to the data gating circuit 802, the detailed description of the data gating circuit 1002 is omitted here for brevity.

More specifically, as shown in FIG. 2A and FIG. 10, the transistors MP5, MN6, MN7, MP9, MN5, MP6, MP7, MN9, and the inverter 404 are controlled by the second clock signal clk_nor and the first clock signal clk_nand respectively, in which the toggling numbers of the second clock signal clk_nor and the first clock signal clk_nand are depended on the activity of the input data D. The more situations of D=Q=1 and D=Q=0 occurred in the input data D, the less power consumed by the transistors MP5, MN6, MN7, MP9, MN5, MP6, MP7, MN9, and the two transistors in the inverter 404. For example, when 20% of the activity of the input data D is D=Q=1 and D=Q=0, each of the ten transistors may represent one effective clock device controlled by the full-activity clock signal. Therefore, by using the data gating circuit 802, the number of effective full-activity transistors may be reduced to 4 from 8.

It is noted that, in another embodiment, the data gating circuit 802 may be eliminated, and the gating circuit may only comprise the data gating circuit 1002 to gate the first clock signal clk_nand according to the input data D. The detailed description is omitted here for brevity.

Figure 11:
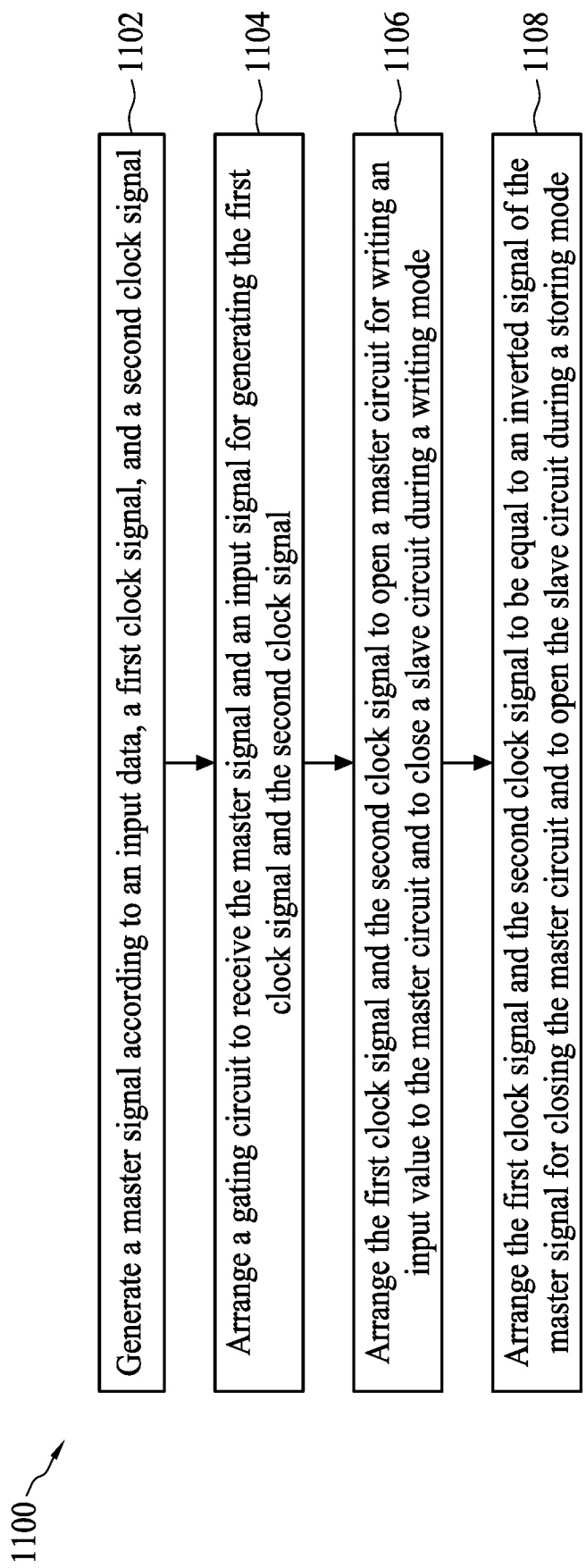
FIG. 11 is a flowchart of a method of operating a flip-flop device in accordance with some embodiments.

According to some embodiments, the operation of the flip-flop device 100 or 200 may be summarized into the operations in FIG. 11. FIG. 11 is a flowchart of a method 1100 of operating a flip-flop device in accordance with some embodiments. The flip-flop device may be the flip-flop device 100 or 200. The method 11000 comprises operations 1102-1108.

In operation 1102, a master signal (e.g. ml_ax) is generated according to an input data (e.g. D). According to some embodiments, the master signal is gated by a first clock signal (e.g. clk_nand) and a second clock signal (e.g. clk_nor).

In operation 1104, a gating circuit is arranged to receive the master signal and an input clock signal (e.g. CP) for generating the first clock signal and the second clock signal. According to some embodiments, for reducing the power consumption of the flip-flop device, the toggling numbers of the first clock signal and the second clock signal are not greater than the toggling number of the input clock signal.

In operation 1106, during the writing mode, the first clock signal with the high voltage level and the second clock signal with the low voltage level are arranged to open a selecting circuit (e.g. 202) for writing the input value to the master circuit and to close a slave circuit (e.g. 210) for holding the input value.

In operation 1108, during the storing mode, the first clock signal and the second clock signal are arranged to be equal to the inverted master signal (e.g. !(ml_ax)) for closing the master circuit to hold the input value and to open the slave circuit for writing the input value to the slave circuit.

According to some embodiments, the method 1000 may further comprise operations 1110 and 1112 for gating the first clock signal and the second clock signal by the input data. More specifically, to further reduce the power consumption of the flip-flop device, in operation 1110, a first data gating circuit (e.g. 802) is arranged to maintain the voltage level of the second clock signal on the high voltage level such that the voltage level of the second clock signal may not be toggled to the low voltage level when D=Q=1.

In operation 1112, to further reduce the power consumption of the flip-flop device, a second data gating circuit (e.g. 1002) is arranged to maintain the voltage level of the first clock signal on the low voltage level such that the voltage level of the first clock signal may not be toggled to the high voltage level when D=Q=0.

According to the operations 1102-1112, the effective devices controlled by the full-activity clock signal are reduced. Therefore, the total power consumption of the flip-flop device may be reduced.

Briefly, in the present embodiments, a flip-flop device is controlled by two internal clock signals, which are gated or decided by the state of the master circuit in the flip-flop device, generated by a gating circuit. The internal clock signals are half-activity clocks, and are used to control the writing and storing of the flip-flop device. Therefore, the power consumption of the flip-flop device may be reduced. Moreover, the power consumption of the gating circuit may be reduced by combining the devices controlled by the same clock. In comparison to the conventional master-slave flip-flop using the transmission gates, the number of devices toggled by the full-activity clock are reduced to 8 from 12, for example. Therefore, the power consumption of the present flip-flop device is smaller than the conventional master-slave flip-flop. Moreover, as there is no transmission gate coupled between the master and slave circuits in the present flip-flop, the failure rate of the present flip-flop may also be reduced. In addition, the gating circuit may further comprise at least one data-driven clock gating circuit without the area and power overhead of the clock gating latch. The data-driven clock gating circuit may further reduce the power consumption of the flip-flop device when D=Q=1 and/or D=Q=0.

According to some embodiments, an integrated circuit is provided. The integrated circuit comprises a flip-flop circuit and a gating circuit. The flip-flop circuit is arranged to receive an input data for generating a master signal during a writing mode according to a first clock signal and a second clock signal, and to output an output data according to the first clock signal and the second clock signal during a storing mode. The gating circuit is coupled to the flip-flop circuit, for generating the first clock signal and the second clock signal according to the master signal and an input clock signal, wherein a first signal transition number of the first clock signal and a second signal transition number of the second clock signal are not greater than a third signal transition number of the input clock signal during the writing mode and the storing mode.

According to some embodiments, a gating circuit is provided. The gating circuit comprises a first NAND gate, a first inverter, a second NAND gate, and a second inverter. The first NAND gate has a first input terminal arranged to receive an input clock signal, a second input terminal arranged to receive a master signal, and an output terminal arranged to output a first clock signal. The first inverter has an input terminal arranged to receive the master signal, and an output terminal arranged to output an inverted master signal. The second NAND gate has a first input terminal arranged to receive the input clock signal, a second input terminal arranged to receive the inverted master signal, and an output terminal arranged to output a second clock signal. The second inverter has an input terminal arranged to receive the second clock signal, and an output terminal arranged to output a third clock signal, wherein a first signal transition number of the first clock signal and a second signal transition number of the second clock signal are not greater than a third signal transition number of the input clock signal.

According to some embodiments, a method for operating a flip-flop device is provided. The method comprises: generating a master signal according to an input data, a first clock signal, and a second clock signal; arranging a gating circuit to receive the master signal and an input signal for generating the first clock signal and the second clock signal; arranging the first clock signal and the second clock signal to have different voltage levels to open a master circuit for writing an input value to the master circuit and to close a slave circuit for holding the input value during a writing mode; and arranging the first clock signal and the second clock signal to be equal to an inverted signal of the master signal for closing the master circuit to hold the input value and to open the slave circuit for writing the input value to the slave circuit during a storing mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
  a flip-flop circuit, arranged to receive an input data for generating a master signal during a writing mode according to a first clock signal and a second clock signal, and to output an output data according to the first clock signal and the second clock signal during a storing mode, wherein two consecutive signal transitions of one of the first clock signal and the second clock signal occur in a period in which the other of the first clock signal and the second clock signal stays at a same signal level; and
  a gating circuit, coupled to the flip-flop circuit, for generating the first clock signal and the second clock signal according to the master signal and an input clock signal;
  wherein a number of signal transitions of the first clock signal during a period of time and a number of signal transitions of the second clock signal during the period of time are not greater than a number of signal transitions of the input clock signal during the period of time during the writing mode and the storing mode.

2. The integrated circuit of claim 1, wherein the flip-flop circuit comprises:
  a selecting circuit, coupled to the gating circuit, for generating the master signal according to the input data, the first clock signal, and the second clock signal;

a master circuit, coupled to the selecting circuit and the gating circuit, for receiving the master signal according to the first clock signal and the second clock signal during the writing mode;

a slave writing circuit, coupled to the master circuit and the gating circuit, for generating a slave signal according to the first clock signal and the second clock signal during the storing mode; and a slave circuit, coupled to the slave writing circuit and the gating circuit, for generating an output data according to the slave signal, the first clock signal, and the second clock signal during the storing mode.

3. The integrated circuit of claim 2, wherein the selecting circuit comprises:
- a first p-type transistor, having a first connecting terminal coupled to a first reference voltage, a control terminal coupled to a scan input;
- a second p-type transistor, having a first connecting terminal coupled to the first reference voltage, a control terminal coupled to a scan enable signal;
- a third p-type transistor, having a first connecting terminal coupled to a second connecting terminal of the first p-type transistor, a control terminal coupled to an inverted scan enable signal;
- a fourth p-type transistor, having a first connecting terminal coupled to a second connecting terminal of the second p-type transistor, a control terminal coupled to the input data;
- a fifth p-type transistor, having a first connecting terminal coupled to a second connecting terminal of the third p-type transistor and a second connecting terminal of the fourth p-type transistor, a control terminal coupled to the second clock signal, a second connecting terminal arranged to output the master signal;
- a first n-type transistor, having a first connecting terminal coupled to a second reference voltage, a control terminal coupled to the scan input;
- a second n-type transistor, having a first connecting terminal coupled to the second reference voltage, a control terminal coupled to the inverted scan enable signal;
- a third n-type transistor, having a first connecting terminal coupled to a second connecting terminal of the first n-type transistor, a control terminal coupled to the scan enable signal;
- a fourth n-type transistor, having a first connecting terminal coupled to a second connecting terminal of the second n-type transistor, a control terminal coupled to the input data; and
- a fifth n-type transistor, having a first connecting terminal coupled to a second connecting terminal of the third n-type transistor and a second connecting terminal of the fourth n-type transistor, a control terminal coupled to the first clock signal, a second connecting terminal arranged to output the master signal.

4. The integrated circuit of claim 2, wherein the master circuit comprises:
- a first p-type transistor, having a first connecting terminal coupled to a first reference voltage, a control terminal coupled to the first clock signal, and a second connecting terminal arranged to output the master signal; and
- a first n-type transistor, having a first connecting terminal coupled to a second reference voltage, a control terminal coupled to the second clock signal, and a second connecting terminal arranged to output the master signal.

5. The integrated circuit of claim 2, wherein the slave writing circuit comprises:
- a first p-type transistor, having a first connecting terminal coupled to a first reference voltage, a control terminal coupled to the first clock signal, and a second connecting terminal arranged to output the slave signal; and
- a first n-type transistor, having a first connecting terminal coupled to a second reference voltage, a control terminal coupled to the second clock signal, and a second connecting terminal arranged to output the slave signal.

6. The integrated circuit of claim 2, wherein the slave circuit comprises:
- a first inverter, having an input terminal arranged to receive the slave signal, and an output terminal arranged to output an inverted slave signal;
- a second inverter, having an input terminal arranged to receive the slave signal, and an output terminal arranged to output the output data;
- a first p-type transistor, having a first connecting terminal coupled to a first reference voltage, a control terminal coupled to the output terminal of the first inverter;
- a second p-type transistor, having a first connecting terminal coupled to a second connecting terminal of the first p-type transistor, a control terminal coupled to the second clock signal, and a second connecting terminal arranged to receive the slave signal;
- a first n-type transistor, having a first connecting terminal coupled to a second reference voltage, a control terminal coupled to the output terminal of the first inverter; and
- a second n-type transistor, having a first connecting terminal coupled to a second connecting terminal of the first n-type transistor, a control terminal coupled to the first clock signal, and a second connecting terminal arranged to receive the slave signal.

7. The integrated circuit of claim 1, wherein the gating circuit comprises:
- a NAND gate, having a first input terminal arranged to receive the input clock signal, a second input terminal arranged to receive the master signal, and an output terminal arranged to output the first clock signal;
- an inverter, having an input terminal arranged to receive the input clock signal, and an output terminal arranged to output an inverted clock signal; and
- a NOR gate, having a first input terminal coupled to the output terminal of the inverter, a second input terminal arranged to receive the master signal, and an output terminal arranged to output the second clock signal.

8. The integrated circuit of claim 1, wherein the gating circuit comprises:
- a first NAND gate, having a first input terminal arranged to receive the input clock signal, a second input terminal arranged to receive the master signal, and an output terminal arranged to output the first clock signal;
- a first inverter, having an input terminal arranged to receive the master signal, and an output terminal arranged to output an inverted master signal;
- a second NAND gate, having a first input terminal arranged to receive the input clock signal, a second input terminal arranged to receive the inverted master signal, and an output terminal arranged to output a fourth clock signal; and
- a second inverter, having an input terminal arranged to receive the fourth clock signal, and an output terminal arranged to output the second clock signal.

9. The integrated circuit of claim 8, wherein the first NAND gate comprises:

a first p-type transistor, having a first connecting terminal coupled to a first reference voltage, a second connecting terminal arranged to output the first clock signal, and a control terminal arranged to receive the master signal;

a second p-type transistor, having a first connecting terminal coupled to the first reference voltage, a second connecting terminal arranged to output the first clock signal, and a control terminal arranged to receive the input clock signal;

a first n-type transistor, having a first connecting terminal coupled to the second connecting terminal of the first p-type transistor, a control terminal arranged to receive the master signal; and the second NAND gate comprises:

a third p-type transistor, having a first connecting terminal coupled to the first reference voltage, a second connecting terminal arranged to output the fourth clock signal, and a control terminal arranged to receive the inverted master signal;

a fourth p-type transistor, having a first connecting terminal coupled to the first reference voltage, a second connecting terminal arranged to output the fourth clock signal, and a control terminal arranged to receive the input clock signal;

a second n-type transistor, having a first connecting terminal coupled to the second connecting terminal of the third p-type transistor, a control terminal arranged to receive the inverted master signal; and a third n-type transistor, having a first connecting terminal coupled to a second connecting terminal of the second n-type transistor, a second connecting terminal coupled to a second reference voltage, and a control terminal arranged to receive the input clock signal;

wherein a second connecting terminal of the first n-type transistor is coupled to the first connecting terminal of the third n-type transistor.

10. The integrated circuit of claim 9, wherein the gating circuit further comprises:

a first data gating circuit, coupled to the first NAND gate, for holding the first clock signal on a first voltage level when the input data and the output data are the first voltage level.

11. The integrated circuit of claim 10, wherein the first data gating circuit comprises:

a fifth p-type transistor, having a first connecting terminal coupled to a third reference voltage, a second connecting terminal arranged to output the first reference voltage, and a control terminal coupled to the slave signal;

a sixth p-type transistor, having a first connecting terminal coupled to the third reference voltage, a second connecting terminal arranged to output the first reference voltage, and a control terminal coupled to an inverted input data of the input data;

a seventh p-type transistor, having a first connecting terminal coupled to the third reference voltage, a second connecting terminal arranged to output the first reference voltage, and a control terminal coupled to an inverted scan enable signal;

a fourth n-type transistor, having a first connecting terminal coupled to the second connecting terminal of the first p-type transistor, a control terminal coupled to the slave signal;

a fifth n-type transistor, having a first connecting terminal coupled to a second connecting terminal of the fourth n-type transistor, a control terminal arranged to receive the inverted input data; and a sixth n-type transistor, having a first connecting terminal coupled to a second connecting terminal of the fifth n-type transistor, a second connecting terminal coupled to the second reference voltage, and a control terminal coupled to the inverted scan enable signal.

12. The integrated circuit of claim 10, wherein the gating circuit further comprises:

a second data gating circuit, coupled to the second NAND gate, for holding the second clock signal on a second voltage level when the input data and the output data are the second voltage level.

13. The integrated circuit of claim 12, wherein the second data gating circuit comprises:

a fifth p-type transistor, having a first connecting terminal coupled to a third reference voltage, a second connecting terminal arranged to output the first reference voltage, and a control terminal coupled to the input data;

a sixth p-type transistor, having a first connecting terminal coupled to the third reference voltage, a second connecting terminal arranged to output the first reference voltage, and a control terminal coupled to an inverted slave signal;

a seventh p-type transistor, having a first connecting terminal coupled to the third reference voltage, a second connecting terminal arranged to output the first reference voltage, and a control terminal coupled to an inverted scan enable signal;

a fourth n-type transistor, having a first connecting terminal coupled to the second connecting terminal of the third p-type transistor, a control terminal coupled to the input data;

a fifth n-type transistor, having a first connecting terminal coupled to a second connecting terminal of the fourth n-type transistor, a control terminal coupled to the inverted slave signal; and a sixth n-type transistor, having a first connecting terminal coupled to a second connecting terminal of the fifth n-type transistor, a second connecting terminal coupled to the second reference voltage, and a control terminal coupled to the inverted scan enable signal.

14. A gating circuit, comprising:

a first NAND gate, having a first input terminal arranged to receive an input clock signal, a second input terminal arranged to receive a master signal, and an output terminal arranged to output a first clock signal;

a first inverter, having an input terminal arranged to receive the master signal, and an output terminal arranged to output an inverted master signal;

a second NAND gate, having a first input terminal arranged to receive the input clock signal, a second input terminal arranged to receive the inverted master signal, and an output terminal arranged to output a second clock signal; and a second inverter, having an input terminal arranged to receive to the second clock signal, and an output terminal arranged to output a third clock signal;

wherein a number of signal transitions of the first clock signal during a period of time and a number of signal transitions of the second clock signal during the period of time are not greater than a number of signal transitions of the input clock signal during the period of time; the gating circuit further comprises:

a first data gating circuit, coupled to the output terminal of one of the first NAND gate and the second NAND gate, for holding one of the first clock signal and the second clock signal outputted from the output terminal of the one of the first NAND gate and the second NAND gate on a first voltage level when input data received by a flip-flop circuit and output data, generated by the flip-flop circuit according to the first clock signal and the second clock signal, are the first voltage level.

15. The gating circuit of claim 14, wherein the first NAND gate comprises:
   a first p-type transistor, having a first connecting terminal coupled to a first reference voltage, a second connecting terminal arranged to output the first clock signal, and a control terminal arranged to receive the master signal;
   a second p-type transistor, having a first connecting terminal coupled to the first reference voltage, a second connecting terminal arranged to output the first clock signal, and a control terminal arranged to receive the input clock signal;
   a first n-type transistor, having a first connecting terminal coupled to the second connecting terminal of the first p-type transistor, a control terminal arranged to receive the master signal; and
   the second NAND gate comprises:
   a third p-type transistor, having a first connecting terminal coupled to the first reference voltage, a second connecting terminal arranged to output the second clock signal, and a control terminal arranged to receive the inverted master signal;
   a fourth p-type transistor, having a first connecting terminal coupled to the first reference voltage, a second connecting terminal arranged to output the second clock signal, and a control terminal arranged to receive the input clock signal;
   a second n-type transistor, having a first connecting terminal coupled to the second connecting terminal of the third p-type transistor, a control terminal arranged to receive the inverted master signal; and
   a third n-type transistor, having a first connecting terminal coupled to a second connecting terminal of the second n-type transistor, a second connecting terminal coupled to a second reference voltage, and a control terminal arranged to receive the input clock signal;
   wherein a second connecting terminal of the first n-type transistor is coupled to the first connecting terminal of the third n-type transistor.

16. The gating circuit of claim 15, wherein the first data gating circuit is coupled to the output terminal of the second NAND gate, comprises:
   a fifth p-type transistor, having a first connecting terminal coupled to a third reference voltage, a second connecting terminal arranged to output the first reference voltage, and a control terminal coupled to the input data;
   a sixth p-type transistor, having a first connecting terminal coupled to the third reference voltage, a second connecting terminal arranged to output the first reference voltage, and a control terminal coupled to an inverted slave signal;
   a seventh p-type transistor, having a first connecting terminal coupled to the third reference voltage, a second connecting terminal arranged to output the first reference voltage, and a control terminal coupled to an inverted scan enable signal;
   a fourth n-type transistor, having a first connecting terminal coupled to the second connecting terminal of the third p-type transistor, a control terminal coupled to the input data;
   a fifth n-type transistor, having a first connecting terminal coupled to a second connecting terminal of the fourth n-type transistor, a control terminal coupled to the inverted slave signal; and
   a sixth n-type transistor, having a first connecting terminal coupled to a second connecting terminal of the fifth n-type transistor, a second connecting terminal coupled to the second reference voltage, and a control terminal coupled to the inverted scan enable signal.

17. The gating circuit of claim 14, wherein the gating circuit further comprises:
   a second data gating circuit, coupled to the output terminal of the other of the first NAND gate and the second NAND gate, for holding the other of the first clock signal and the second clock signal outputted from the output terminal of the other of the first NAND gate and the second NAND gate on a second voltage level when the input data and the output data are the second voltage level.

18. The gating circuit of claim 15, wherein the first data gating circuit is coupled to the output terminal of the first NAND gate, and comprises:
   a fifth p-type transistor, having a first connecting terminal coupled to a third reference voltage, a second connecting terminal arranged to output the first reference voltage, and a control terminal coupled to a slave signal;
   a sixth p-type transistor, having a first connecting terminal coupled to the third reference voltage, a second connecting terminal arranged to output the first reference voltage, and a control terminal coupled to an inverted input data of the input data;
   a seventh p-type transistor, having a first connecting terminal coupled to the third reference voltage, a second connecting terminal arranged to output the first reference voltage, and a control terminal coupled to an inverted scan enable signal;
   a fourth n-type transistor, having a first connecting terminal coupled to the second connecting terminal of the first p-type transistor, a control terminal coupled to the slave signal;
   a fifth n-type transistor, having a first connecting terminal coupled to a second connecting terminal of the fourth n-type transistor, a control terminal arranged to receive the inverted input data; and
   a sixth n-type transistor, having a first connecting terminal coupled to a second connecting terminal of the fifth n-type transistor, a second connecting terminal coupled to the second reference voltage, and a control terminal coupled to the inverted scan enable signal.

19. The gating circuit of claim 17, wherein the first voltage level is equal to the second voltage level.

20. A method for operating a flip-flop device, comprising:
   generating a master signal according to an input data, a first clock signal, and a second clock signal;
   arranging a gating circuit to receive the master signal and an input signal for generating the first clock signal and the second clock signal;
   arranging the first clock signal and the second clock signal to have different voltage levels to open a master circuit for writing an input value to the master circuit and to close a slave circuit for holding the input value during a writing mode; and arranging the first clock signal and the second clock signal to be equal to an inverted signal of the master signal for closing the master circuit to hold the input value and to open the slave circuit for writing the input value to the slave circuit during a storing mode.

* * * * *